(12) United States Patent
Sei et al.

(10) Patent No.: US 10,627,428 B2
(45) Date of Patent: Apr. 21, 2020

(54) CURRENT DETECTION DEVICE

(71) Applicant: Yazaki Corporation, Tokyo (JP)

(72) Inventors: Makoto Sei, Makinohara (JP); Toshiaki Fukuhara, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 106 days.

(21) Appl. No.: 16/021,338

(22) Filed: Jun. 28, 2018

(65) Prior Publication Data

US 2019/0025349 A1 Jan. 24, 2019

(30) Foreign Application Priority Data

Jul. 18, 2017 (JP) ................................ 2017-138790

(51) Int. Cl.
| | |
|---|---|
| *G01R 15/20* | (2006.01) |
| *G01R 31/364* | (2019.01) |
| *G01R 19/00* | (2006.01) |
| *G01R 33/07* | (2006.01) |
| *H01M 10/48* | (2006.01) |
| *H01R 13/66* | (2006.01) |
| *H01R 13/639* | (2006.01) |

(52) U.S. Cl.
CPC ....... *G01R 15/207* (2013.01); *G01R 19/0092* (2013.01); *G01R 31/364* (2019.01); *G01R 33/07* (2013.01); *H01M 10/48* (2013.01); *H01M 2220/20* (2013.01); *H01R 13/639* (2013.01); *H01R 13/6683* (2013.01)

(58) Field of Classification Search
CPC .... H01M 10/48; G01R 33/07; G01R 19/0092
See application file for complete search history.

(56) References Cited

U.S. PATENT DOCUMENTS

| | | | | |
|---|---|---|---|---|
| 8,917,081 | B2 * | 12/2014 | Fukuyama | ........... G01R 15/207 324/117 R |
| 2006/0119343 | A1 * | 6/2006 | Saito | ................... B60R 16/0239 324/117 H |
| 2010/0066350 | A1 * | 3/2010 | Matsumura | .......... G01R 15/207 324/120 |
| 2010/0259255 | A1 * | 10/2010 | Hashio | ................. G01R 15/207 324/244 |

(Continued)

FOREIGN PATENT DOCUMENTS

JP 2010-164517 A 7/2010

*Primary Examiner* — Alvaro E Fortich

(74) *Attorney, Agent, or Firm* — Sughrue Mion, PLLC

(57) ABSTRACT

Provided is a current detecting device capable of lowering manufacturing cost, including a strip-like bus bar, a magnetic field detection element, a magnetic member, and a housing that holds these components. The magnetic member includes a bottom plate portion, and a pair of standing wall portions erected from both end portions in the width direction of the bottom plate portion. The pair of standing wall portions positions therebetween the bus bar and the magnetic field detecting element. The housing is provided with a locking arm for retaining the magnetic member. The locking arm is provided with an arm portion configured to be located between the standing wall portion and the bus bar and elastically deformable in an opposing direction of the standing wall portions, and a locking portion protruding from a tip of the arm portion and is configured to engage with the standing wall portion.

12 Claims, 13 Drawing Sheets

(56) References Cited

U.S. PATENT DOCUMENTS

| | | | |
|---|---|---|---|
| 2011/0148407 A1 | 6/2011 | Kawaguchi et al. | |
| 2013/0320968 A1* | 12/2013 | Sakamoto | G01R 33/0094 324/244 |
| 2014/0329401 A1* | 11/2014 | Ivan | H01R 13/627 439/345 |

* cited by examiner

CURRENT DETECTION DEVICE

TECHNICAL FIELD

The present invention relates to a current detection device including a bus bar.

BACKGROUND ART

There is a structure shown in FIGS. 14 to 16 as an example of a conventionally known current detection device. The current detection device 301 includes a bus bar 302, a printed circuit board 330 on which a Hall element is mounted, a magnetic member 304 for concentrating the magnetic flux, and a housing 305 for holding these components. The current detection device 301 detects a current value flowing through the bus bar 302 in such a manner that when a current flows in the bus bar 302 and a magnetic field is generated around, the Hall element outputs a voltage corresponding to a strength of the magnetic field (for example, refer to Patent Document 1).

The current detection device 301 fixes a bus bar 302 and the magnetic member 304 in such a manner that the printed circuit board 330, the bus bar 302 and the magnetic member 304 are in order assembled to the housing 305 before by thermally-welding the retaining portions 351 and 352 provided on the housing 305.

The retaining portion 351 is a portion for fixing the bus bar 302, and before the thermal welding is, as indicated by a one-dot chain line in FIG. 16, formed in a cylindrical shape with a smaller diameter than a round hole 320 formed through the bus bar 302. The retaining portion 351 fixes the bus bar 302 by passing through the round hole 320 and heating and pressing so that a distal end portion becomes a shape with a larger diameter than the round hole 320 as shown by a solid line in FIG. 16.

The retaining portion 352 is a portion for fixing the magnetic member 304 and before thermal welding is, as shown by a one-dot chain line in FIG. 16, formed in a plate shape extending in a height direction of the housing 305. The retaining portion 352 is heated and bent at a right angle, whereby the magnetic member 304 presses a bottom plate portion of the member 304 and fixes the magnetic member 304.

Patent Document

Patent Document 1: Japanese Patent Application Laid-Open No. 2010-164517

DISCLOSURE OF THE INVENTION

Problems to be Solved by the Invention

Because the above-described conventional current detection device 301 had a structure where thermal welding of the retaining portion 352 fixes the magnetic member 304 to the housing 305, welding equipment and welding head were necessary, resulting in an increase in manufacturing cost.

It is therefore an object of the present invention to provide a current detection device capable of reducing the manufacturing cost.

Means for Solving the Problems

In order to solve the above problem, the current detection device of the present invention includes a plate-like bus bar, a magnetic field detecting element for detecting magnetic field generated by a current flowing through the bus bar, a magnetic member, and a housing holding the bus bar, the magnetic field detecting element, and the magnetic member, the magnetic member includes a bottom plate portion in a flat plate shape and a pair of standing wall portions standing from both end portions of the bottom plate portion and positioning therebetween the bus bar and the magnetic field detecting element, the housing is provided with a locking arm for retaining the magnetic member, and the locking arm is provided with an arm portion located between the standing wall portion and the bus bar and elastically deformable in an opposing direction of the standing wall portions, and a locking portion protruding from a tip of the arm portion and engages with the standing wall portion, and the arm portion is restrained from bending inward by the bus bar.

Advantages of the Invention

According to the present invention, since the housing includes the locking arm for retaining the magnetic member, a retaining portion retaining the magnetic member by thermal welding can be eliminated and the manufacturing cost of the current detection device can therefore be reduced.

MODE FOR CARRYING OUT THE INVENTION

Figure 1:
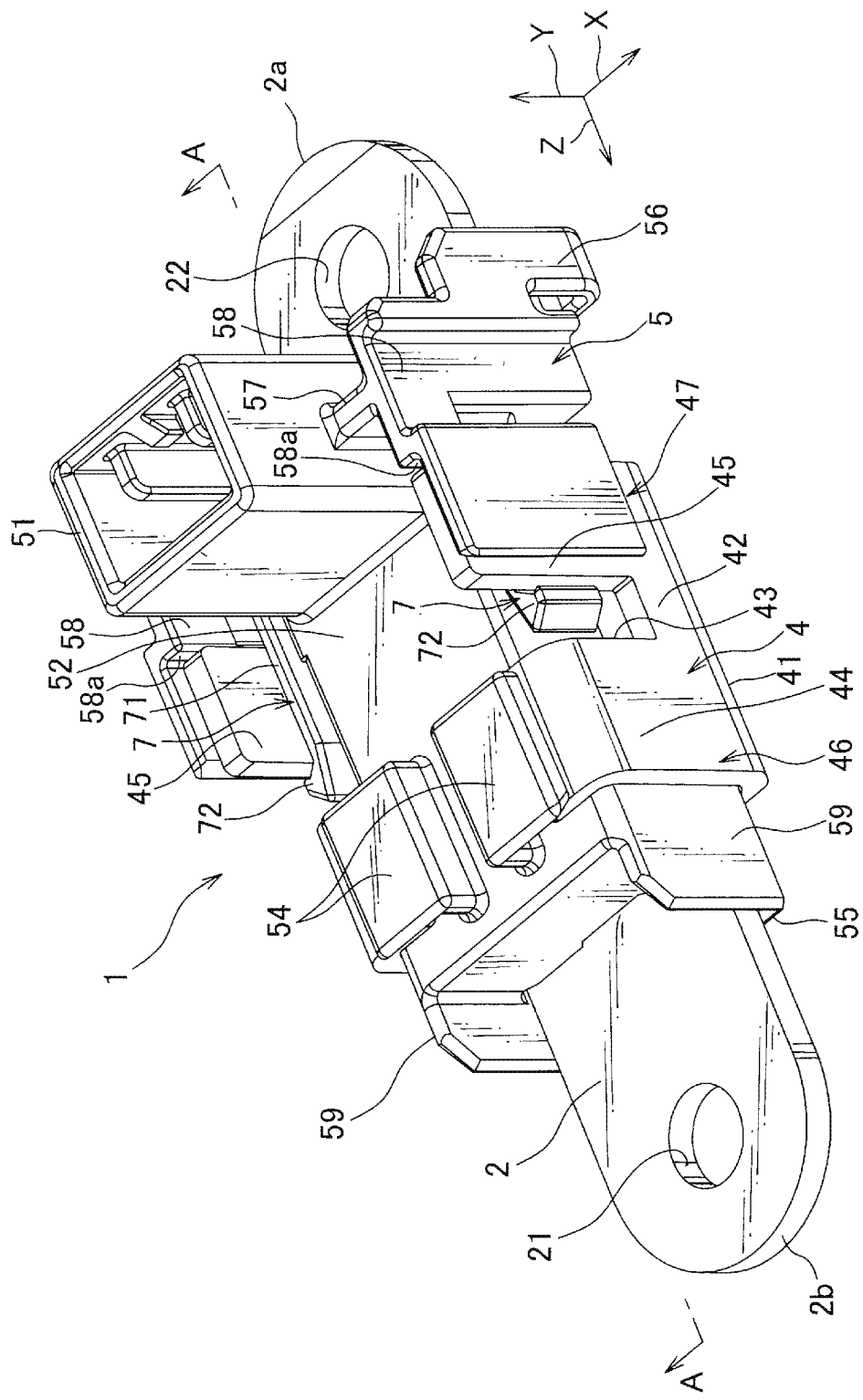
FIG. 1 is a perspective view of a current detection device according to a first embodiment of the present invention.

The current detection device according to a first embodiment of the present invention will be described with reference to FIGS. 1 to 13.

The current detection device 1 shown in FIGS. 1 to 13 is a device for detecting a current flowing between a vehicle-mounted power supply (for example, a battery) and an electric equipment (for example, a motor). The current detection device 1 includes a strip-shaped bus bar 2, a printed circuit board 30 on which the two magnetic field detecting elements 31 and 32 are mounted, a magnetic member 4, and a housing 5 holding these components while insulating them from each other.

Figure 7:
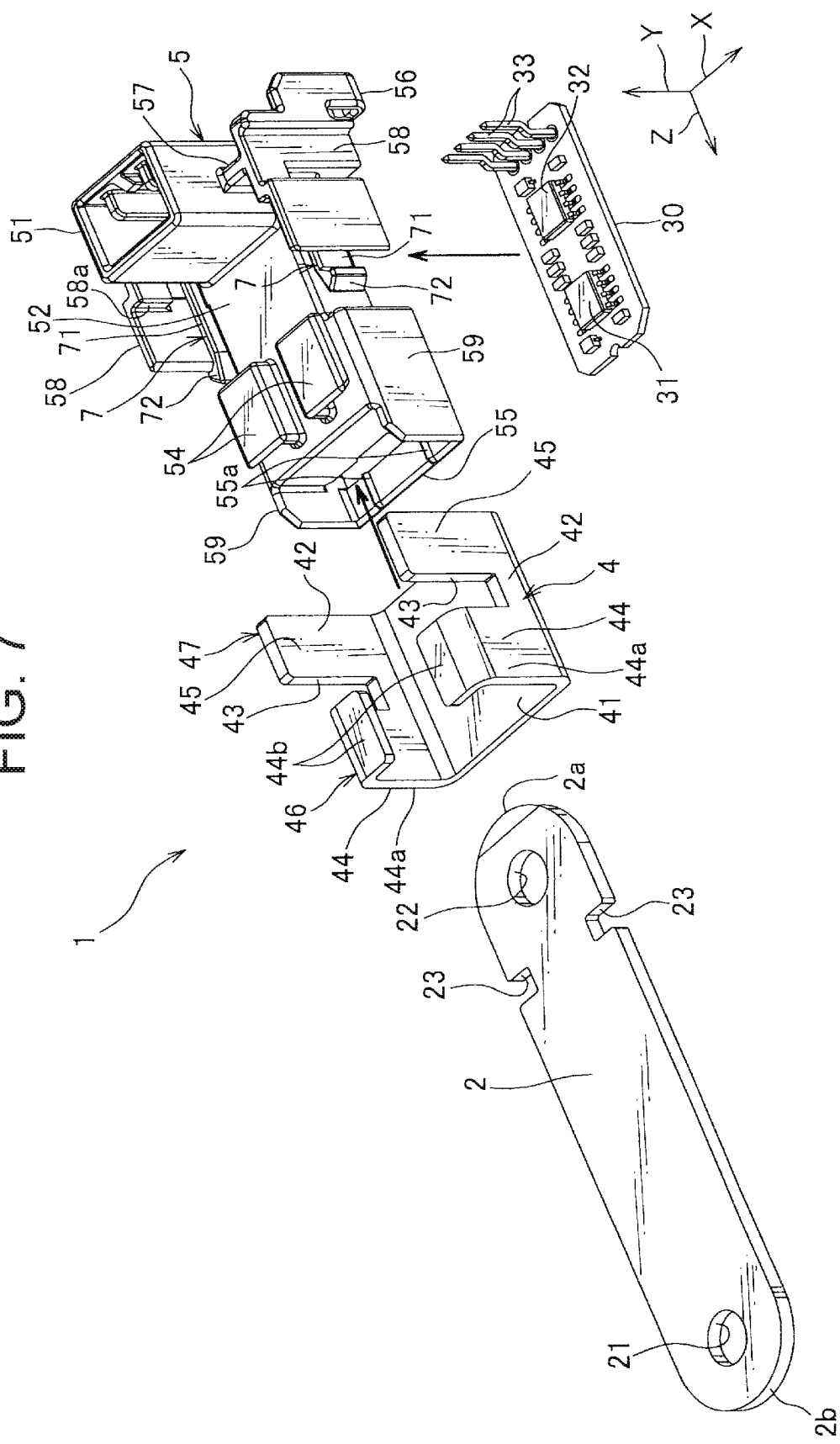
FIG. 7 is an exploded view of the current detection device of FIG. 1.
Figure 8:
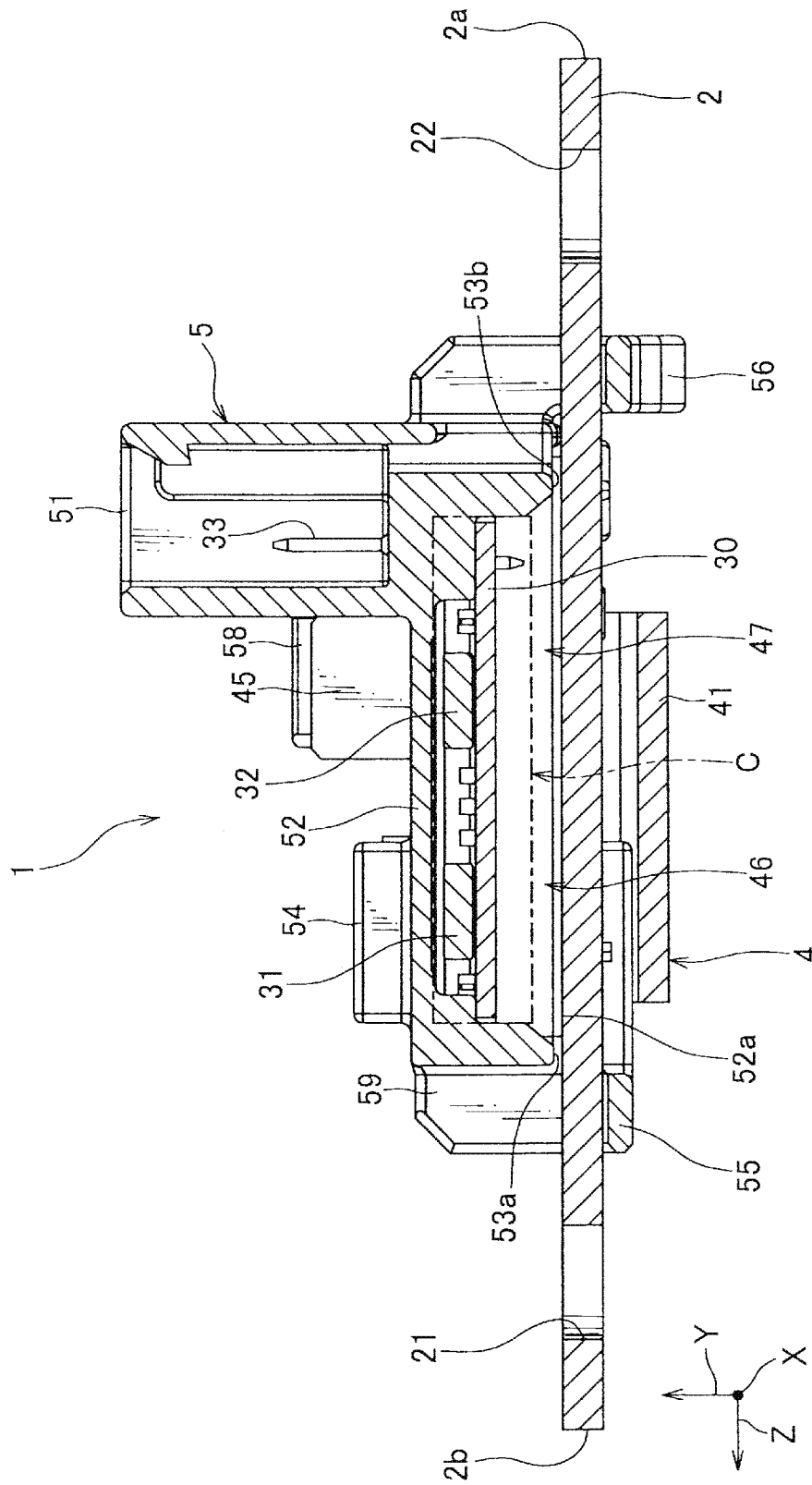
FIG. 8 is a cross-sectional view taken along the line A-A in FIG. 1.

In FIGS. 1 to 13, an arrow X is parallel to a width direction of the bus bar 2, an arrow Y is parallel to a thickness direction of the bus bar 2, and an arrow Z is parallel to a longitudinal direction of the bus bar 2. As shown in FIG. 8, the bus bar 2, the printed circuit board 30, and a bottom plate part 41 (described later) of the magnetic member 4 are arranged opposite each other at an interval in the direction of the arrow Y. Also, the bus bar 2, the printed circuit board 30, and the magnetic member 4 are not in contact with each other.

In the current detection device 1 of the specification, with reference to the bus bar 2, a side on which the printed circuit board 30 is placed is defined as an upper side, and a side on which the bottom plate part 41 is placed is defined as a lower side. Also, "upper side" and "lower side" in the specification may not agree with actual upper side and lower side when the current detection device 1 is used.

The bus bar 2 is made of a conductive metal such as copper or aluminum. Both ends of the bus bar 2 in the longitudinal direction have connection holes 21 and 22 having circular shape in a plan view formed penetrating therethrough. The both ends of the bus bar 2 where these connection holes 21, 22 are formed are electrically respectively connected with a power supply and an electric equipment, directly or via an electric wire etc.

Both side end faces of the bus bar 2 in the width direction are formed in parallel to each other. Both end faces in the longitudinal direction of the bus bar 2, that is, the end face 2a on the connection hole 22 side of the bus bar 2 and the end face 2b on the connection hole 21 side are each formed in a semicircular shape in a plan view. As shown in FIG. 7, the bus bar 2 is assembled to the housing 5 by sliding from the end face 2a along its longitudinal direction. Hereinafter, the end face 2a is referred to as a front end face 2a, and the end face 2b as a rear end face 2b.

In the current detection device 1 of the specification, the front end face 2a side of the bus bar 2 is defined as a front side, and the rear end face 2b side of the bar 2 is defined as a rear side. Further, in the specification, "front side" and "rear side" may not match the actual front side and the rear side when the flow detection device 1 is used.

On both widthwise end portions of the bus bar 2 on the side of the front end face 2a, cutout portions 23 each having a rectangular shape in a plan view are provided. These cutout portions 23 allow each retaining protrusion 8 (described later) of the housing 5 to fit in.

The printed circuit board 30 is formed in a rectangular plate shape. The two magnetic field detecting elements 31, 32 are mounted on the same face (the upper face in this embodiment) of the printed circuit board 30. Also, the two magnetic field detecting elements 31, 32 are arranged with a space in the longitudinal direction of the printed circuit board 30. In addition, a plurality of pin-like terminals 33 is electrically connected to the printed circuit board 30. The plurality of pin-like terminals 33 is arranged in the connector connecting portion 51 of the housing 5 described later.

In the present embodiment, the magnetic field detecting elements 31 and 32 are Hall elements, detecting strength of the magnetic field where they are arranged. That is, by applying a voltage under the magnetic field generated by current flowing in the bus bar 2, the magnetic field detecting elements 31, 32 output a voltage responsive to the strength of the magnetic field. In the present embodiment, the same magnetic field detecting elements 31, 32 are used.

The magnetic member 4 is made of a ferromagnetic material such as iron, and magnetic permeability thereof is higher than that of other components of the current detection device 1, and the magnetic flux preferentially passes. The magnetic member 4 is obtained by pressing one plate material or the like, and integrally includes a plate-like bottom plate portion 41 and a pair of standing wall portions 42 respectively erected from the widthwise end portions of the bottom plate portion 41. The pair of standing wall portions 42 positions therebetween the bus bar 2 and the magnetic field detecting elements 31, 32. The bottom plate portion 41 is arranged in such a manner that its upper face faces the lower face of the bus bar 2.

As shown in FIG. 7, the standing wall portion 42 includes a cutout portion 43 extending from a tip in the height direction toward the bottom plate portion 41. Therefore, the standing wall portion 42 is divided by the cutout portion 43 into a first portion 44 and a second portion 45. The first portion 44 is bent to face the bottom plate portion 41. A portion of the first portion 44 perpendicular to the bottom plate portion 41 is referred to as a "low wall portion" and is denoted by reference numeral 44a. A portion of the first portion 44 that faces the bottom plate portion 41 is referred to as "opposing plate portion" and is denoted by reference numeral 44b. The distal ends of the opposing plate portions 44b of the pair of standing wall portions 42 are spaced apart from each other. The second portion 45 has a height dimension (a dimension in the Y direction) larger than the low wall portion 44a. Hereinafter, the second portion 45 is referred to as a high wall portion 45.

As shown in FIG. 7, the magnetic member 4 is assembled to the housing 5 by sliding along a face direction of the bottom plate portion 41 from the side of the high wall portion 45.

In such magnetic member 4, a closed portion 46 having a C-shaped cross portion (C shape as seen in the direction of the arrow Z) is constituted by the bottom plate portion 41, the pair of low wall portions 44a, and the pair of opposing plate portions 44b, and opening portion 47 having a U-shaped cross portion (U shape as seen in the direction of the arrow Z) is constituted by the plate portion 41 and the pair of high wall portions 45. When a current flows in the bus bar 2 and a magnetic field is generated, magnetic flux tends to concentrate in the closing portion 46. Further, in the opening portion 47, the magnetic flux is difficult to concentrate as compared with the closing portion 46. Therefore, the inside of the closed portion 46 has a stronger magnetic field than the inside of the opening portion 47. The magnetic field detecting element 31 is disposed inside the closed portion 46, and the magnetic field detecting element 32 is disposed inside the opening portion 47.

With such an arrangement, when a large current flows through the bus bar 2, the magnetic field is not strengthened at the opening portion 47 as compared with the closed portion 46, and the magnetic field can be detected by the magnetic field detection element 32 disposed at the opening portion 47. Further, when a small current flows through the bus bar 2, the magnetic field becomes stronger at the closed portion 46 as compared with the opening portion 47, and therefore, the small current can be detected by the magnetic field detecting element 31 disposed at the closed portion 46.

That is, the current detection device 1 is made such that in order to be able to detect a wide range of current values using the magnetic field detecting elements 31, 32 having the same configuration (the range of detectable magnetic flux densities is the same), by devising the shape of the magnetic member 4, any of the magnetic flux density at the closing portion 46 when the small current flows and the magnetic flux density at the opening portion 47 when a large current flows are included in a detectable range of the magnetic field detecting elements 31 and 32.

The housing 5 is made of an insulating synthetic resin, and integrally includes a board accommodating portion 52, a connector connecting portion 51, a magnetic member holding section, and a bus bar holding section.

The board accommodating portion 52 is formed in a box shape opened downward. The printed circuit board 30 is, as shown by the arrow in FIG. 7, accommodated from below in the board accommodating portion 52, and is held in the board accommodating portion 52 by filling mold material in the board accommodating portion 52. The part C in FIG. 8 shows a range which is filled with mold material.

The connector connecting portion 51 is continuous with the upper face on the front side of the board accommodating portion 52 and is formed in a tubular shape opened upward. On the inner side of the connector connecting portion 51, the plurality of pin-like terminals 33 is arranged. The connector connecting portion 51 is connected to an appropriate connector so that measured values of the magnetic field detecting elements 31 and 32 are externally outputted.

The magnetic member holding section holds the magnetic member 4 in the X direction, the Y direction and the Z direction with respect to the housing 5 so as not to move to either direction. The magnetic member holding section includes a pair of abutment faces 58a each abutting against the end face on the opposite side (front side) to the cutout portion 43 of the high wall portions 45, a pair of locking arms 7 for preventing removal of the magnetic member 4, and a pair of pressing portions 54a pressing the pair of opposing plate portions 44b against the bottom plate portion 41 side.

Figure 2:
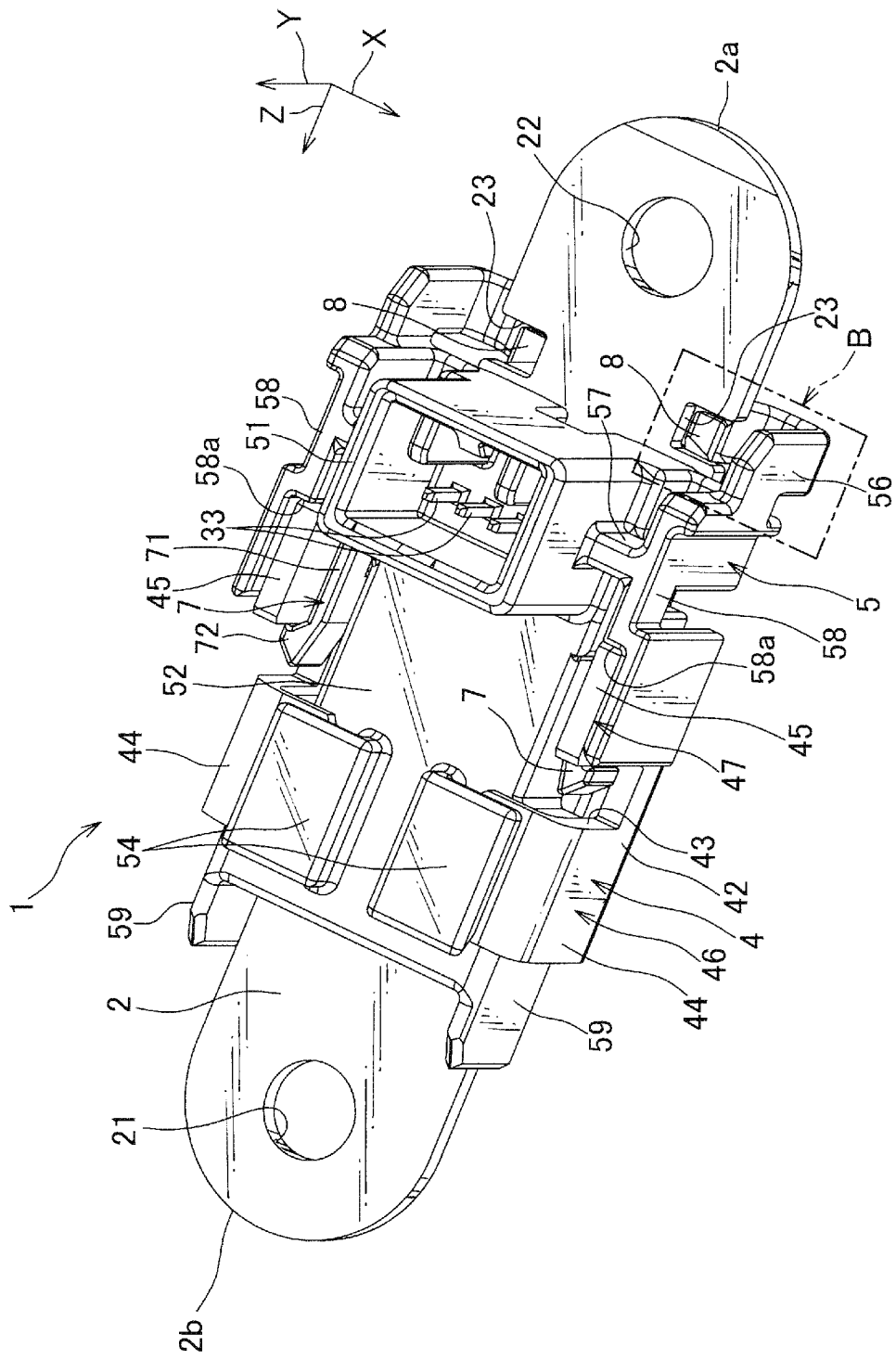
FIG. 2 is a perspective view of the current detection device of FIG. 1 as viewed from another angle.
Figure 11:
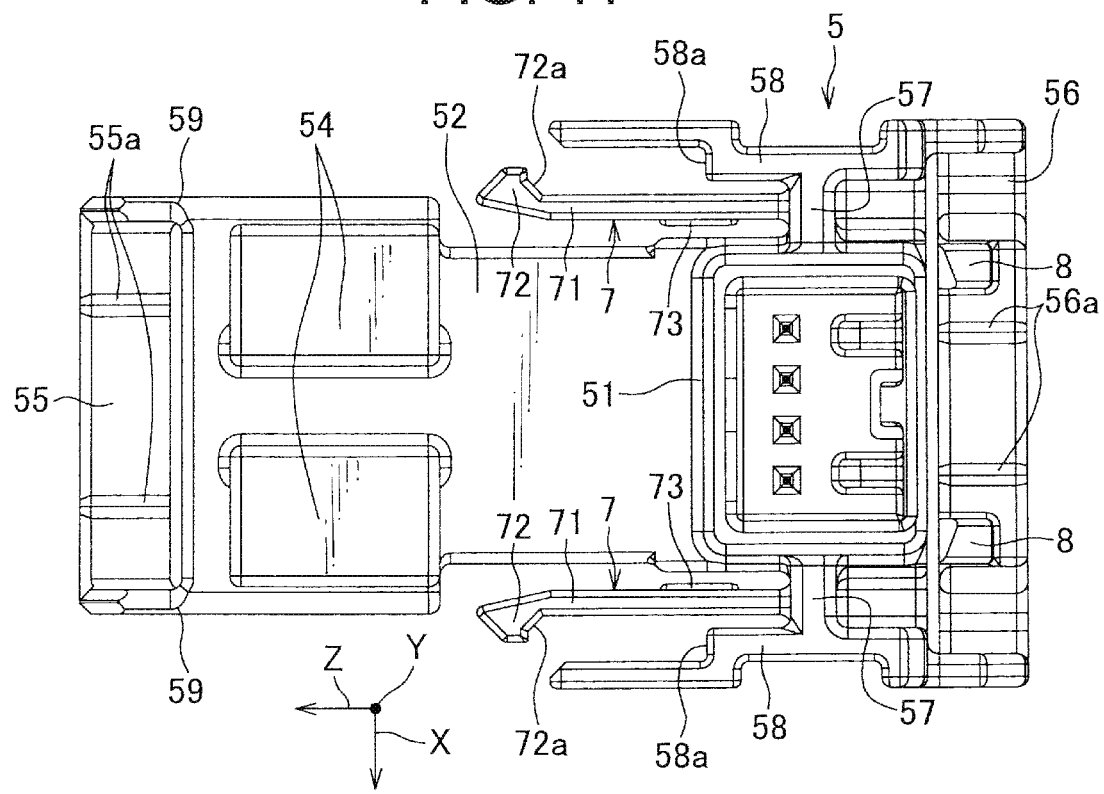
FIG. 11 is a plan view showing only the housing of FIG. 4.

As shown in FIGS. 1, 2, 11 and the like, the pair of abutment faces 58a is provided with a pair of walls 58 for positioning the connector connecting portion 51 and the board accommodating portion 52 therebetween. Also, each wall 58 is connected to the side face of the connector connecting portion 51 and the board accommodating portion 52 by a connecting portion 57.

Figure 4:
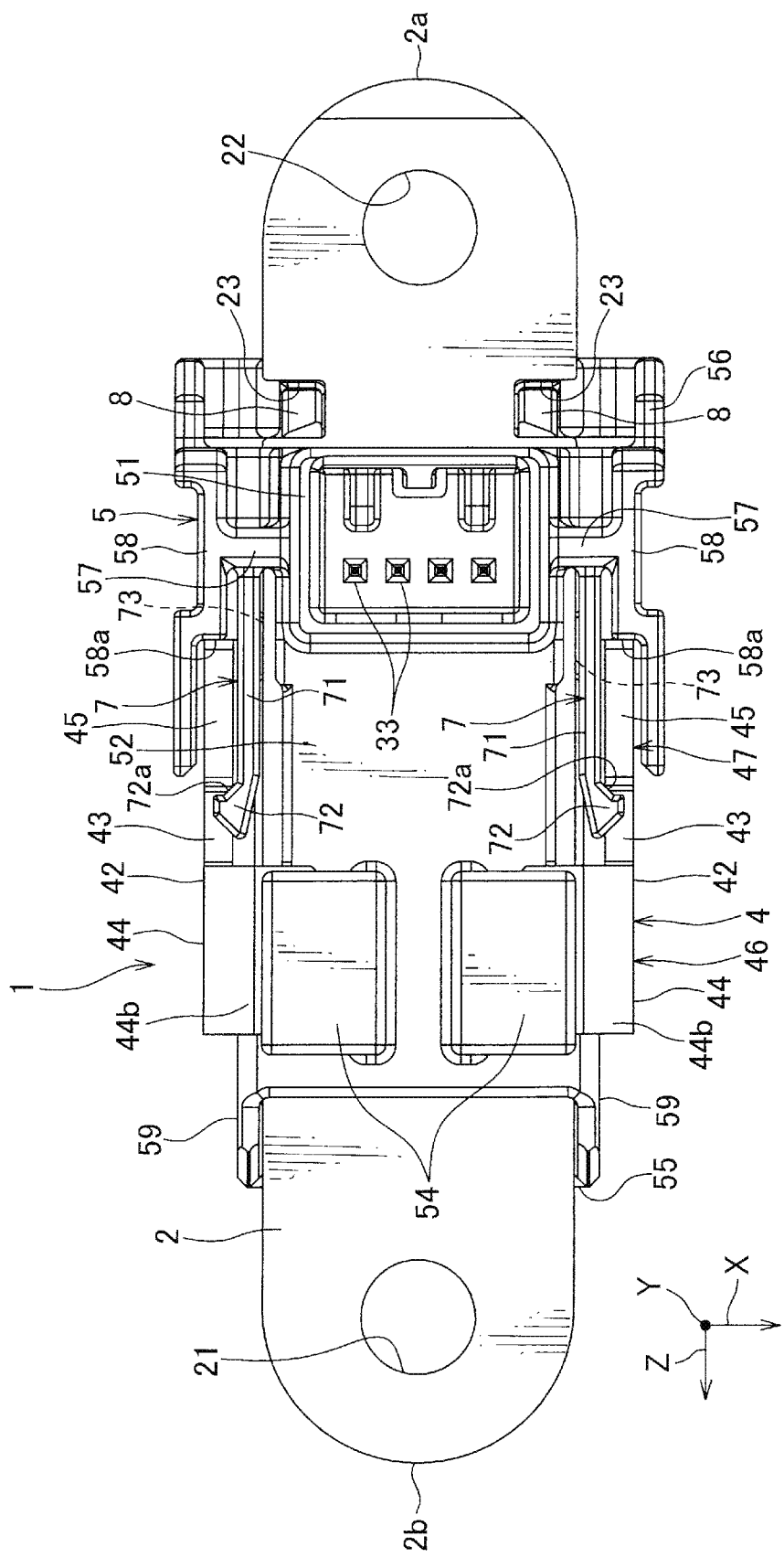
FIG. 4 is a plan view of the current detection device of FIG. 1.
Figure 13:
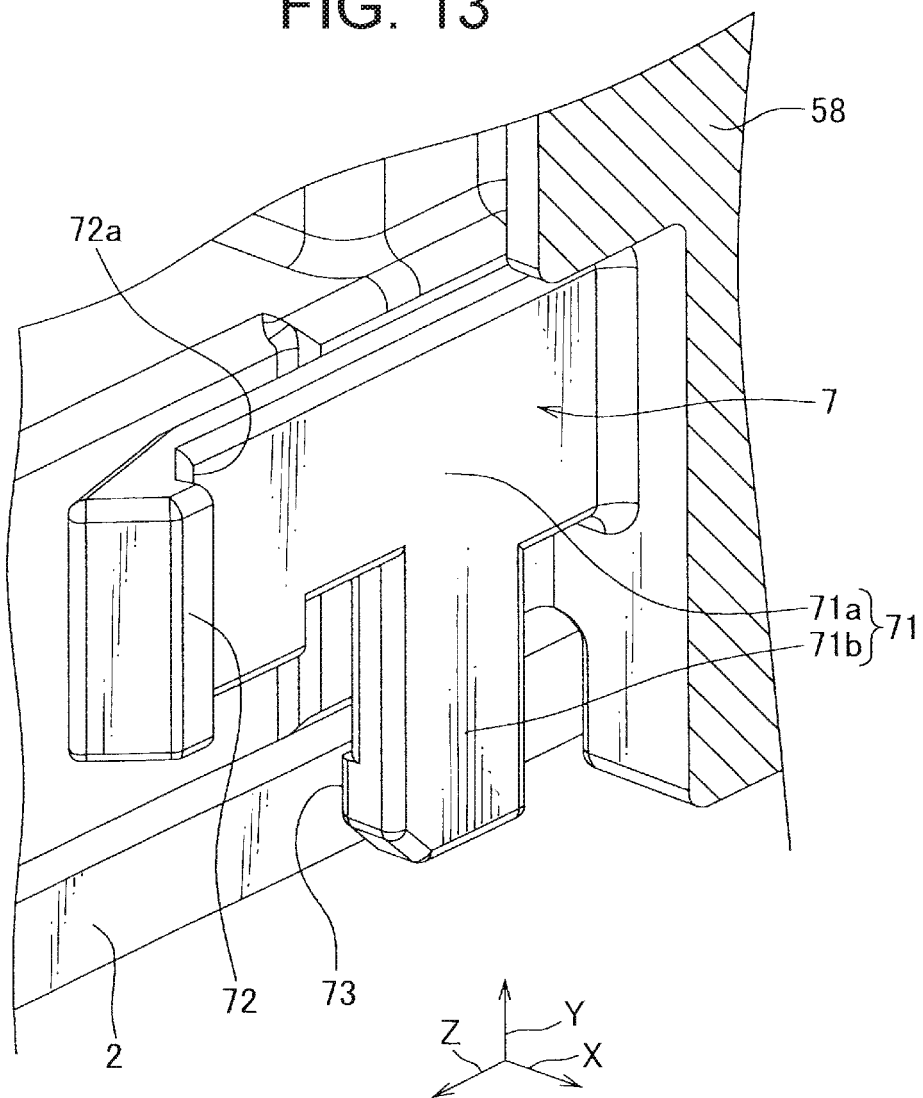
FIG. 13 is a view for explaining a configuration of a locking arm provided in the housing of FIG. 1.
Figure 14:
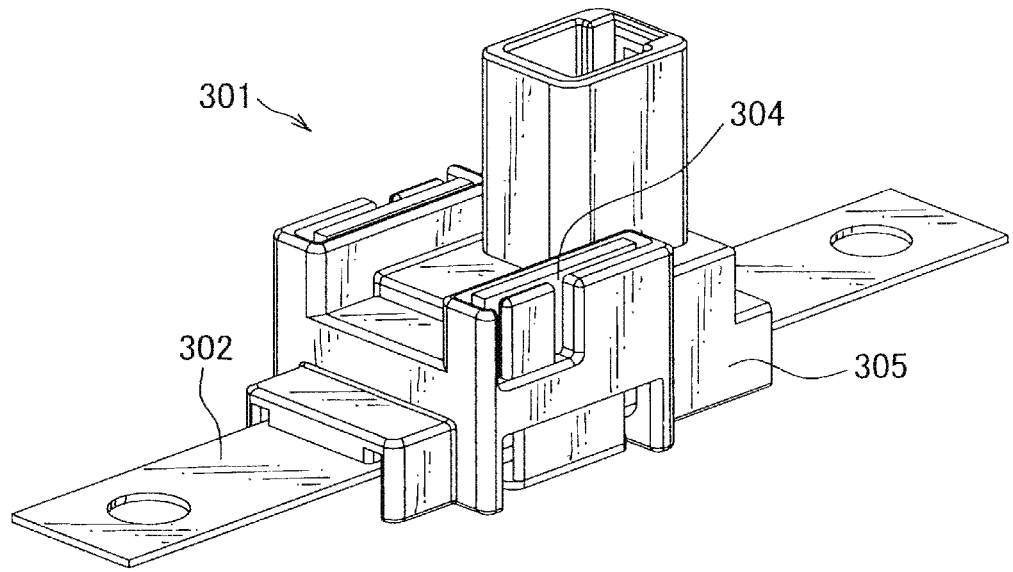
FIG. 14 is a perspective view of a conventional current detection device.
Figure 15:
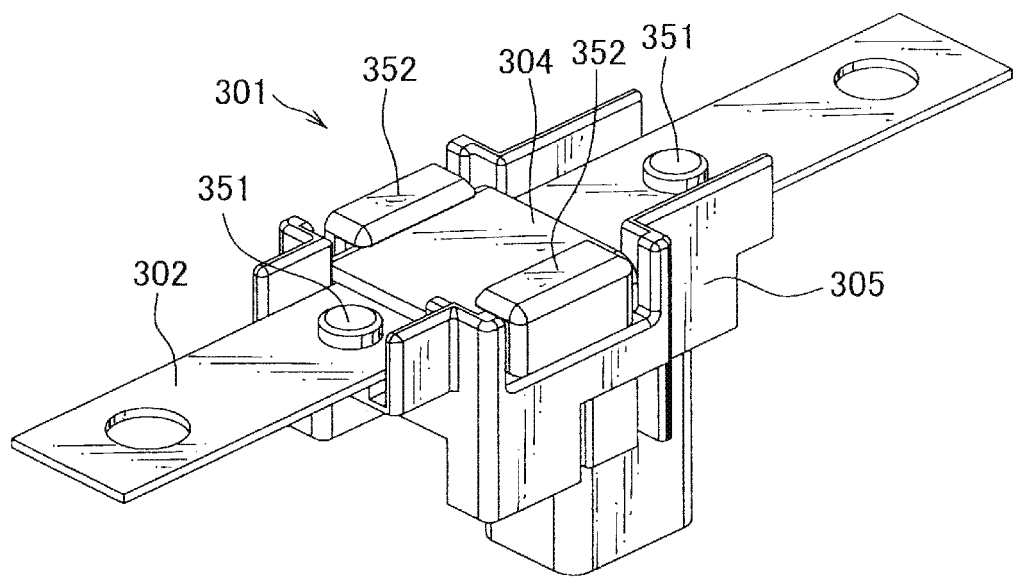
FIG. 15 is a perspective view of the current detection device of FIG. 14 as viewed from a bottom face side.
Figure 16:
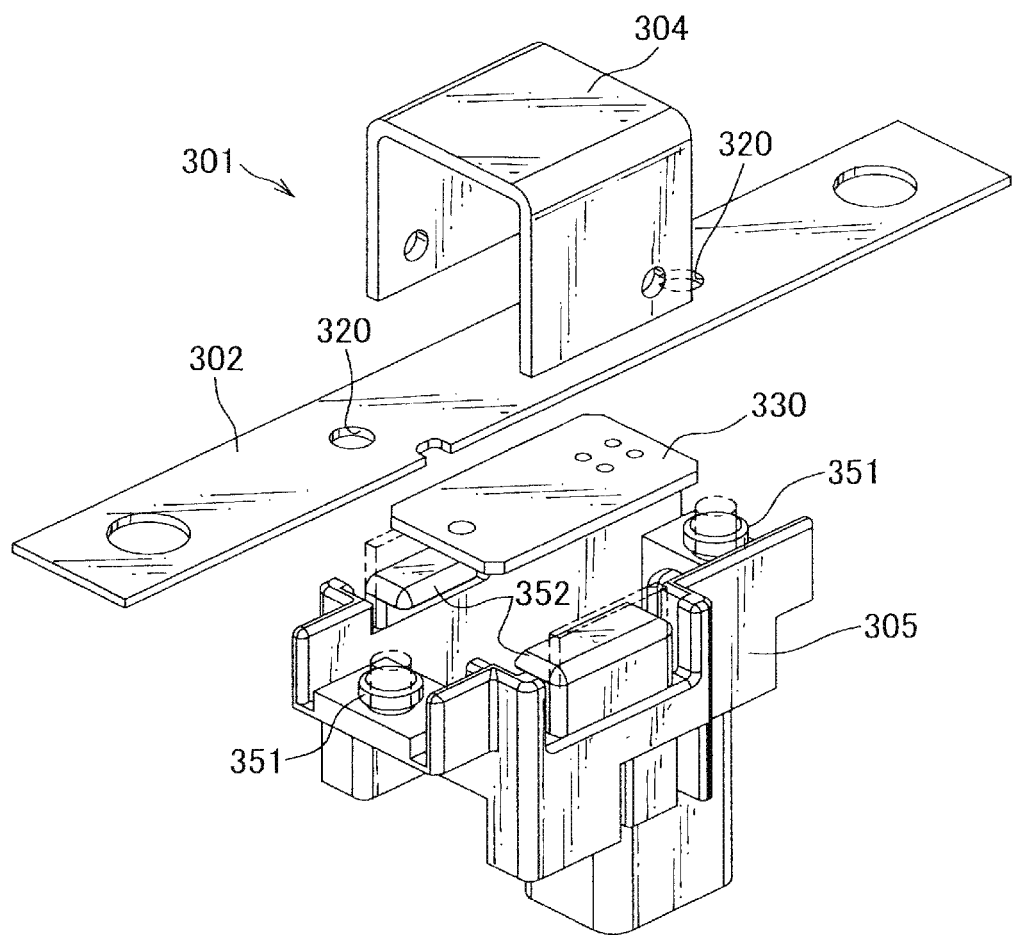
FIG. 16 is an exploded view of the current detection device of FIG. 15.

As shown in FIGS. 4, 13 and the like, the pair of locking arms 7 respectively include an arm portion 71 that is arranged between the standing wall portion 42 and the bus bar 2 and is elastically deformable in the opposing direction of the standing wall portions 42, a locking portion 72 that protrudes from a distal end of the arm portion 71 and locks on the standing wall portion 42, and a protruding portion 73 that protrudes from the arm portion 71 and contacts the side end face in the width direction of the bus bar 2.

In the present embodiment, the arm portion 71 is constituted by an extended horizontal portion 71a formed like a cantilever plate in the direction of the arrow Z (rear side) from the connecting portion 57, and a hanging portion 71b descending from an intermediate portion of the horizontal portion 71a. The locking portion 72 protrudes from a distal end (rear end) of the horizontal portion 71a away from the connecting portion 57 toward the outside of the housing 5. In the present embodiment, the locking portion 72 locks on the cutout portion 43. The protruding portion 73 extends from the lower end of the hanging portion 71b away from the horizontal portion 71a to the inside of the housing 5.

Further, the locking portion 72 is provided with a contact face 72a forming an obtuse angle with the horizontal portion 71a. The contact face 72a contacts an inner edge portion of the cutout portion 43, that is, an edge of the rear end of the high wall portion 45, and presses the edge to the outer side in the width direction of the housing 5 and the side of the contact face 58a (front side), so as to fix the magnetic member 4 not to move with respect to the housing 5 in two directions of the X direction and the Z direction.

Assembling of the magnetic member 4 to the housing 5 is performed before the assembly of the bus bar 2. When the magnetic member 4 is slid at the time of assembly, the high wall portion 45 hits the locking portion 72, so as to bend the arm portion 71 inward in the width direction of the housing 5. Then, when the high wall portion 45 passes the locking portion 72 and comes into contact with the contact face 58a, the deflection of the arm portion 71 is restored and the locking portion 72 is engaged with the cutout portion 43. In this state, as described above, the contact face 72a contacts the edge of the high wall portion 45.

Thereafter, the bus bar 2 is slidably inserted between the pair of locking arms 7, and the bus bar 2 is assembled in the housing 5. When the bus bar 2 is slidably inserted between the pair of locking arms 7, the bus bar 2 hits the protruding portion 73 and slightly expands a space between the pair of locking arms 7. It follows from this that the contact face 72a of the locking portion 72 is moved to the outside in the width direction of the housing 5 to reliably contact the edge of the high wall portion 45.

In a state where the magnetic member 4 and the bus bar 2 are assembled to the housing 5, the bus bar 2 is located between the pair of locking arms 7, and the side end face of the bus bar 2 is in contact with the protruding portion 73 of each locking arm 7, so that deflection of the arm portion 71 inward is restricted. As a result, it is prevented that the locking portion 72 is released so that the magnetic member 4 is detached from the housing 5.

The above-described hanging portion 71b and the protruding portion 73 are not indispensable, and it may be configured that the horizontal portion 71a abuts against the side end face in the width direction of the bus bar 2. In the present embodiment, providing the hanging portion 71b and the protruding portion 73 can reduce an ill effect that the horizontal portion 71a suffers when the housing 5 thermally expands under a high temperature environment.

Figure 5:
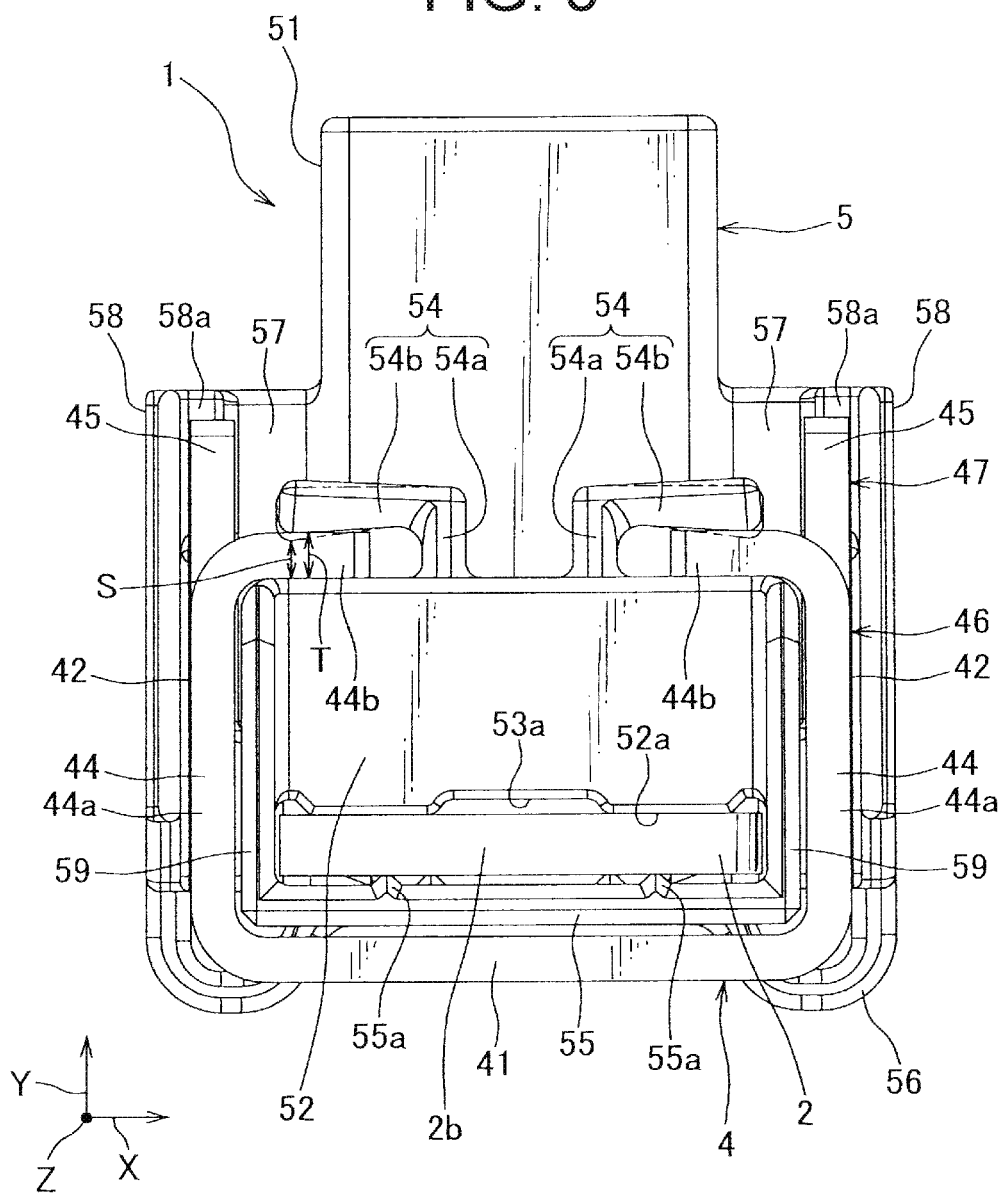
FIG. 5 is a rear view of the current detection device of FIG. 1.

As shown in FIG. 5, each of the pair of pressing portions 54 is constituted by a base part 54a erected from the upper face on the rear side of the board accommodating portion 52, and a plate part 54b extending outward in the width direction of the housing 5 from the upper end of the base part 54a. The pressing portion 54 is in a natural state (indicated by a chain line in FIG. 5), a distance S between the plate portion 54b and the upper face of the board accommodating portion 52 is formed narrower than the plate thickness T of the opposing plate portion 44b. Such a pressing portion 54 presses the opposing plate portion 44b positioned between the plate portion 54b and the upper face of the board accommodating portion 52 toward the upper face side of the board accommodating portion 52 (that is, the bottom plate portion 41 side) by the plate portion 54b, so as to hold the magnetic member 4 not to move with respect to the housing 5 in the Y direction.

The bus bar holding section holds the bus bar 2 in the X direction, the Y direction and the Z direction with respect to the housing 5. The bus bar holding section includes eight ribs 55a, 56a, 58b, 59a for pressing the lower face and the side end face of the bus bar 2, and a pair of retaining protrusions 8 fitting in the cutout portions 23, respectively.

Figure 3:
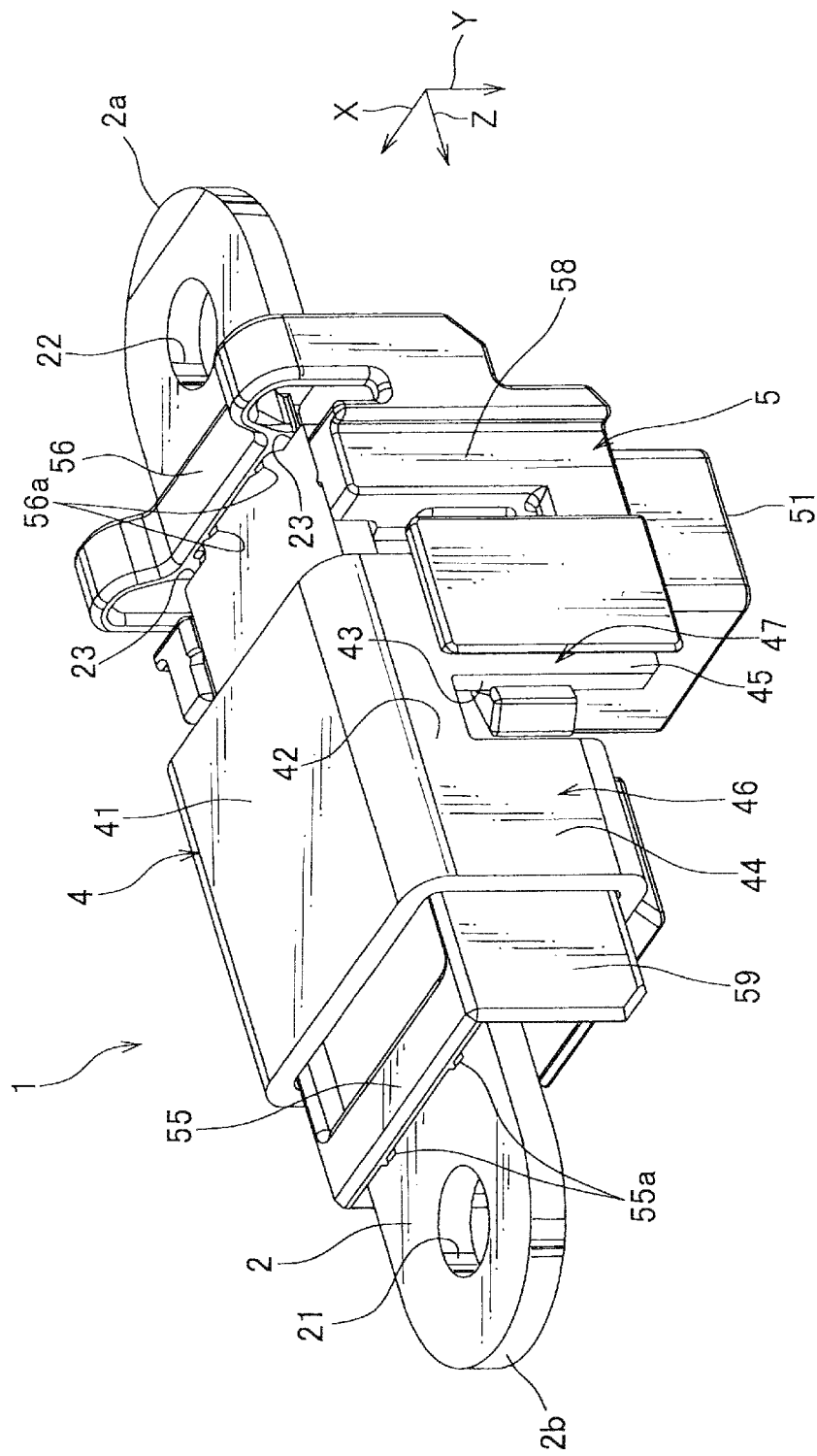
FIG. 3 is a perspective view of the current detection device of FIG. 1 as viewed from a bottom face side.

The housing 5 includes a pair of rear end walls 59 and a bridge portion 55 connecting the pair of rear end walls 59, and the rib 55a is, as shown in FIGS. 3, 5, 11, etc., provided at the bridge portion 55.

The pair of rear end walls 59 are walls respectively in continuation with the side facing the board accommodating portion 52 in the width direction (arrow X direction), extending further downward from the lower end 52a of the side face and extending further to the rear side beyond the rear end of the side face. The pair of rear end walls 59 follows along both side end faces of the bus bar 2 in the width direction.

The bridge portion 55 is a plate-like portion connecting the rear end and the lower end of the pair of rear end walls 59 to each other. The bridge portion 55 is located at the rear end of the housing 5. The bridge portion 55 follows along the lower face in the vicinity of the connection hole 21 of the bus bar 2.

The rib 55a extends in the direction of the arrow Z and is formed in a triangular cross portion with a sharp peak. Further, the pair of ribs 55a is provided at the bridge portion 55. The pair of ribs 55a extends parallel to each other with an interval in the direction of the arrow X. As shown in FIG. 5, the pair of ribs 55a contacts the lower face of the bus bar 2 inserted between the lower end 52a of the board accommodating portion 52 and the bridge portion 55, and presses the bus bar 2 toward the lower end 52a of the board accommodating portion 52.

The housing 5 includes a bridge portion 56 connecting the pair of walls 58 described above, and as shown in FIGS. 3, 6, 11 and the like, the rib 56a is provided at the bridge portion 56. The bridge portion 56 is located at the front end of the housing 5. The bridge portion 56 follows along the lower face near the connection hole 22.

Figure 6:
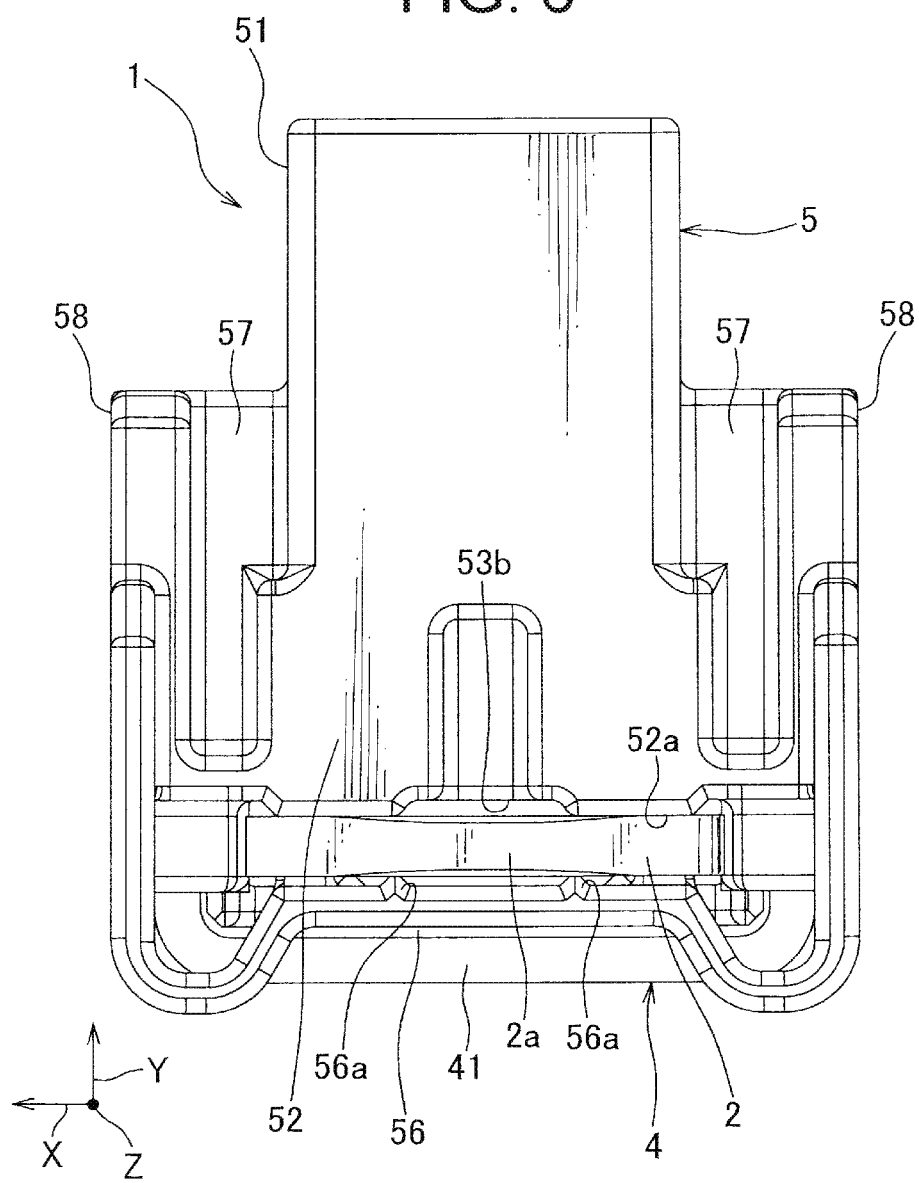
FIG. 6 is a front view of the current detection device of FIG. 1.

Like the above-described rib 55a, the rib 56a extends in the direction of the arrow Z, and has a triangular cross portion with a sharp peak. Further, the pair of ribs 56a is provided at the bridge portion 56. The pair of ribs 56a extends parallel to each other with a space therebetween in the arrow X direction. As shown in FIG. 6, the rib 56a is brought into contact with the lower face of the bus bar 2 inserted between the lower end 52a of the board accommodating portion 52 and the bridge portion 56, so as to press the bus bar 2 to the side of the lower end 52a of the board accommodating portion 52.

Figure 12:
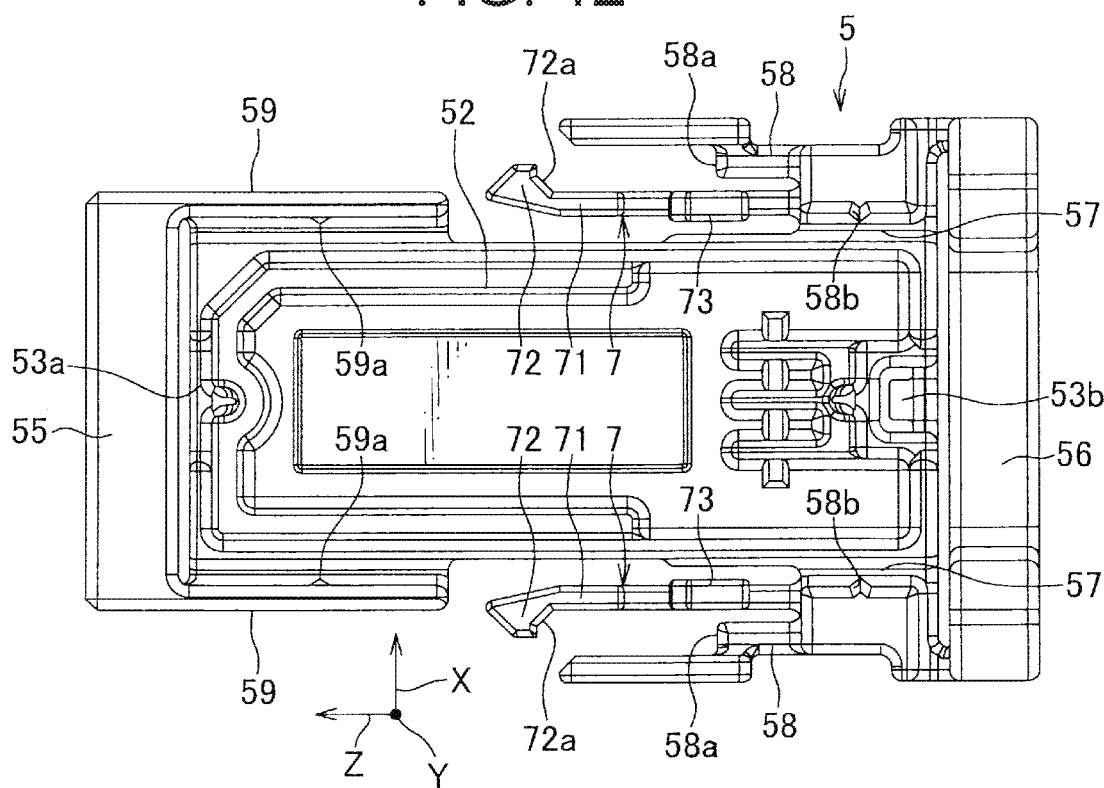
FIG. 12 is a bottom view of the housing of FIG. 11.

The above-described pair of walls 58 further extends downward than the lower end 52a of the side face opposed in the width direction of the board accommodating portion 52. The lower ends of the pair of walls 58 follow both side edges in the width direction of the bus bar 2. As shown in FIG. 12, the ribs 58b are provided one by one at the lower end portions of the pair of walls 58.

The rib 58b extends in the direction of the arrow Y and is formed in a triangular cross portion with a sharp peak. The pair of ribs 58b is in contact with both end faces in the width direction of the bus bar 2, respectively, and presses the bus bars 2. Further, when assembling the bus bar 2 to the housing 5, the bus bar 2 is, while crushing the tops of the pair of ribs 58b, passes between the pair of ribs 58b.

As shown in FIG. 12, the rib 59a is provided one by one at each of the lower end portions of the pair of rear end walls 59.

Like the above-described rib 58b, the rib 59a extends in the direction of the arrow Y, and has a triangular cross portion with a sharp peak. The pair of ribs 59a contacts both end faces of the bus bar 2 in the width direction, so as to press the bus bar 2, respectively. Further, the bus bar 2, at the time of assembling to the housing 5, while crushing the top portions of the pair of ribs 59a, passes between the pair of ribs 59a.

Figure 9:
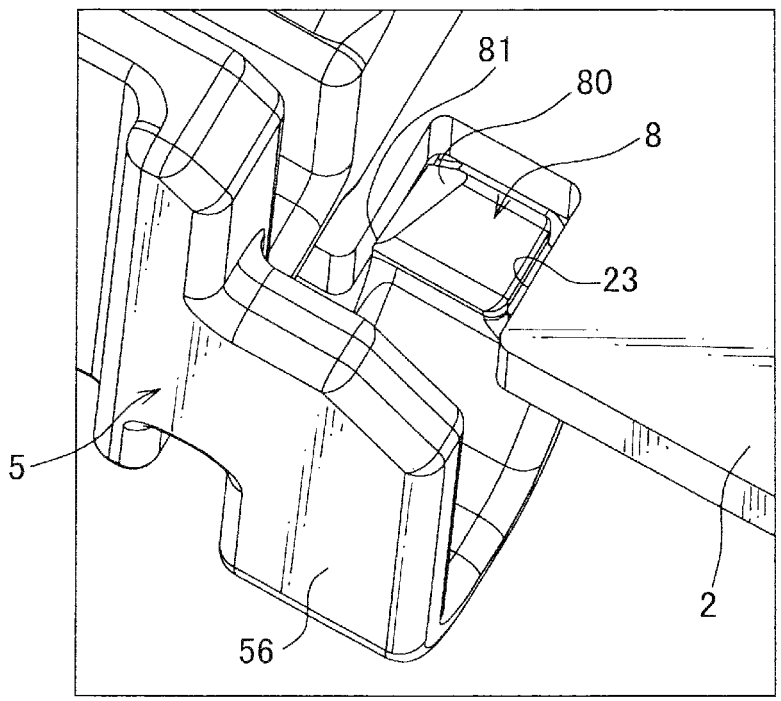
FIG. 9 is an enlarged view of part B in FIG. 2.
Figure 10:
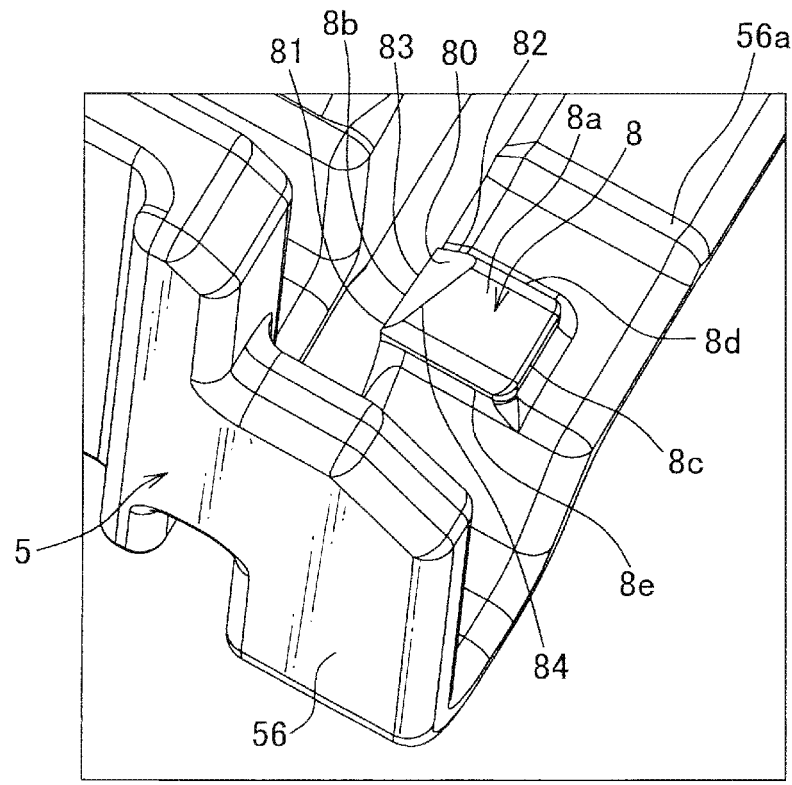
FIG. 10 is a view showing only the housing of FIG. 9.

A pair of retaining protrusions 8 is, as shown in FIG. 11, provided at the bridge portion 56. In addition, the pair of retaining protrusions 8 is disposed outside the above-described rib 56a in the direction of the arrow X. The retaining protrusions 8 is, as shown in FIGS. 9 to 10, formed into a shape having a tapered face 80 on its rectangle body which fits into the cutout 23 of the bus bar 2.

At the rear end portion of the retaining protruding portion 8, the tapered face 80 is provide for improving the insertability of the bus bar 2 at the time of assembling the bus bar 2 to the housing 5. The tapered face 80 is formed in such manner that the inner corner portion of the rear end among the four corner portions of the retaining protruding portion 8 is cut away. The tapered face 80 is a triangle-shaped face in a plan view, and has three sides 82, 83, 84.

The side 82 is positioned on the inner side face 8d of the retaining protruding portion 8, and is inclined in a direction approaching the upper face 8a as going from the rear end face 8b toward the front end face 8c. The side 83 is located on the rear end face 8b of the retaining protruding portion 8, and is inclined in a direction approaching the upper face 8a as going from the inner side 8d toward the outside face 8e. The side 84 is positioned on the upper face 8a of the stopper protrusion 8 and approaches the front end face 8c as directed from the outer face 8e to the inner face 8d. That is, the tapered face 80 is inclined in the direction approaching the upper face 8a as going from the rear end face 8b to the front end face 8c side, and also is inclined in the direction approaching the upper face 8a as going from the inner face 8d toward the outer face 8e.

When assembling the bus bar 2 to the housing 5, the front end face 2a slides on the tapered face 80, and slides forward as pushing down the retaining protrusion 8. At this time, because the front end face 2a of the bus bar 2 is formed in a circular shape in a plan view, that is, the front end face 2a of the bus bar 2 has chamfered corners, the front end face 2a, without abutting against the rear end face 8b of the retaining protrusion 8, hits the tapered face 80 and smoothly moves over the retaining protruding portion 8. Then, once the cutout 23 comes to the retaining protrusion 8, the pushed-down retaining protrusion 8 returns to its original height and fits into the cutout 23. As a result, the bus bar 2 is prevented from coming off in the direction of the arrow Z. Also, in a state in which the retaining protruding portion 8 is fitted in the cutout portion 23, an engaging margin for the cutout 23 is secured near the corner 81 outside the rear end of the retaining protruding portion 8, so that the bus bar 2 can be prevented to move to the front side.

Further, as shown in FIGS. 5, 6 and 8, the lower end 52a of the front end face and the rear end face that faces in the longitudinal direction (direction of arrow Z) of the board accommodating portion 52 are respectively provided with cutout portions 53a, 53b. These cutouts 53a, 53b form a gap with the upper surface of the bus bar 2. The gaps function as vent holes of the board accommodating portion 52, and moisture-contained air in the board accommodating portion 52 is discharged from this gap, dew condensation inside the board accommodating portion 52 is thus prevented.

In fixing the magnetic member 4 to the housing 5, the above-described current detection device 1 has no place to thermally weld, and the magnetic member 4 can be fixed to the housing 5 only by assembling, with the pair of locking arms 7 and the pair of pressing portions 5. Therefore, welding equipment is no longer necessary, manufacturing cost can be reduced. In addition, assembly man-hours can be reduced.

It is to be noted that the above-described embodiment merely shows a representative form of the present invention, the present invention is not limited to this embodiment. That is, various modifications are made within the scope not deviating from the gist of the present invention. As long as the configuration of the present invention is still provided by such deformation, it goes without saying that the deformation is included in the scope of the invention.

DESCRIPTION OF SYMBOLS 1 current detection device
2 bus bar
4 magnetic member
5 housing
7 locking arm
31, 32 magnetic field detecting element
41 bottom plate portion
42 standing wall portion
71 arm portion
72 locking portion

The invention claimed is:

1. A current detection device, comprising:
a plate-like bus bar;
a magnetic field detecting element for detecting a magnetic field generated by a current flowing through the bus bar;
a magnetic member; and
a housing holding the bus bar, the magnetic field detecting element, and the magnetic member, wherein
the magnetic member includes a bottom plate portion in a flat plate shape and a pair of standing wall portions standing from both end portions of the bottom plate portion and configured to position therebetween the bus bar and the magnetic field detecting element, wherein
the housing is provided with a locking arm for retaining the magnetic member, and the locking arm is provided with an arm portion elastically deformable in an opposing direction of the standing wall portions and configured to be located between a standing wall portion of the standing wall portions and the bus bar, and an oblique protrusion protruding from a tip of the arm portion and configured to engage with the standing wall portion of the standing wall portions, and wherein
the arm portion is restrained from bending inward by the bus bar.

2. The current detection device according to claim 1, wherein
the oblique protrusion is provided with a contact portion configured to contact the standing wall portion of the standing wall portions and forming an obtuse angle with the arm portion.

3. The current detection device according to claim 1, wherein
the locking arm includes a protruding portion protruding from the arm portion and configured to abut against the bus bar.

4. The current detection device according to claim 2, wherein
the locking arm includes a protruding portion protruding from the arm portion and configured to abut against the bus bar.

5. The current detection device according to claim 1, wherein
the standing wall portion of the standing wall portions is provided with a cutout portion extending from a tip of the standing wall portion of the standing wall portions toward the bottom plate portion, and the oblique protrusion is configured to engage with the cutout portion.

6. The current detection device according to claim 2, wherein
the standing wall portion of the standing wall portions is provided with a cutout portion extending from a tip of the standing wall portion of the standing wall portions toward the bottom plate portion, and the oblique protrusion is configured to engage with the cutout portion.

7. The current detection device according to claim 3, wherein
the standing wall portion of the standing wall portions is provided with a cutout portion extending from a tip of the standing wall portion of the standing wall portions toward the bottom plate portion, and the oblique protrusion is configured to engage with the cutout portion.

8. The current detection device according to claim 4, wherein
the standing wall portion of the standing wall portions is provided with a cutout portion extending from a tip of the standing wall portion of the standing wall portions toward the bottom plate portion, and the oblique protrusion is configured to engage with the cutout portion.

9. The current detection device according to claim 5, wherein
the standing wall portion of the standing wall portions is divided into a first portion and a second portion by the cutout portion, one of the first portion and the second portion is bent so as to become a facing portion facing the bottom plate portion, and a pressing portion for pressing the facing portion toward the bottom plate portion is provided in the housing.

10. The current detection device according to claim 6, wherein
the standing wall portion of the standing wall portions is divided into a first portion and a second portion by the cutout portion, one of the first portion and the second portion is bent so as to become a facing portion facing the bottom plate portion, and a pressing portion for pressing the facing portion toward the bottom plate portion is provided in the housing.

11. The current detection device according to claim 7, wherein
the standing wall portion of the standing wall portions is divided into a first portion and a second portion by the cutout portion, one of the first portion and the second portion is bent so as to become a facing portion facing the bottom plate portion, and a pressing portion for pressing the facing portion toward the bottom plate portion is provided in the housing.

12. The current detection device according to claim 8, wherein
the standing wall portion of the standing wall portions is divided into a first portion and a second portion by the cutout portion, one of the first portion and the second portion is bent so as to become a facing portion facing the bottom plate portion, and a pressing portion for pressing the facing portion toward the bottom plate portion is provided in the housing.

* * * * *